United States Patent
Chan

(10) Patent No.: US 11,362,510 B2
(45) Date of Patent: Jun. 14, 2022

(54) POWER SUPPLY DEVICE FOR ELIMINATING MALFUNCTION OF OVERCURRENT PROTECTION

(71) Applicant: Acer Incorporated, New Taipei (TW)

(72) Inventor: Tzu-Tseng Chan, New Taipei (TW)

(73) Assignee: ACER INCORPORATED, New Taipei (TW)

(*) Notice: Subject to any disclaimer, the term of this patent is extended or adjusted under 35 U.S.C. 154(b) by 0 days.

(21) Appl. No.: 16/994,774

(22) Filed: Aug. 17, 2020

(65) Prior Publication Data
US 2021/0313792 A1    Oct. 7, 2021

(30) Foreign Application Priority Data
Apr. 1, 2020   (TW) .................................. 109111179

(51) Int. Cl.
*H02M 1/36*    (2007.01)
*H02H 7/125*   (2006.01)
(Continued)

(52) U.S. Cl.
CPC .............. *H02H 7/125* (2013.01); *H02M 1/36* (2013.01); *H02M 7/217* (2013.01); *H03K 5/24* (2013.01); *H02M 1/0009* (2021.05)

(58) Field of Classification Search
CPC .................................. H02M 1/00; H02M 1/36
See application file for complete search history.

(56) References Cited

U.S. PATENT DOCUMENTS 5,561,239 A * 10/1996 Yasuda .................... F02P 17/12
                                                      324/399
5,995,384 A * 11/1999 Majid ............... H02M 3/33523
                                                      363/21.18
(Continued)

FOREIGN PATENT DOCUMENTS

CN    101165988 A    4/2008
TW    201123663 A    7/2011
(Continued)

OTHER PUBLICATIONS

Chinese language office action dated Nov. 8, 2021, issued in application No. TW 109111179.

*Primary Examiner* — Thienvu V Tran
*Assistant Examiner* — Nusrat Quddus
(74) *Attorney, Agent, or Firm* — McClure, Qualey & Rodack, LLP

(57) ABSTRACT

A power supply device for eliminating overcurrent protection malfunctions includes a first transformer, a power switch element, an output stage circuit, a detection circuit, a feedback compensation circuit, a PWM (Pulse Width Modulation) IC (Integrated Circuit), a second transformer, and a control circuit. The first transformer generates an induced voltage according to an input voltage. The output stage circuit generates an output current according to the induced voltage. The detection circuit monitors the output current and generates a detection voltage according to the output current. The feedback compensation circuit includes a linear optical coupler and a voltage regulator. The feedback compensation circuit generates a coupling current. The second transformer generates a control voltage according to the coupling current. The control circuit selectively enables or disables the linear optical coupler and the voltage regulator according to the detection voltage and the control voltage.

14 Claims, 3 Drawing Sheets

(51) Int. Cl.
*H03K 5/24* (2006.01)
*H02M 7/217* (2006.01)
*H02M 1/00* (2006.01)

(56) References Cited

U.S. PATENT DOCUMENTS

| | | |
|---|---|---|
| 7,989,977 B2 | 8/2011 | Crane |
| 10,157,702 B2 * | 12/2018 | Lin ........................ H01F 27/292 |
| 10,790,752 B1 * | 9/2020 | Chan ........................ H02H 3/243 |
| 11,063,428 B2 | 7/2021 | Tsai et al. |
| 2009/0122578 A1 * | 5/2009 | Beltran ............. H02M 3/33523 363/16 |
| 2012/0314459 A1 * | 12/2012 | Park .................. H02M 3/33523 363/21.17 |
| 2014/0063868 A1 | 3/2014 | Shih et al. |
| 2016/0149504 A1 * | 5/2016 | Quigley ............ H02M 3/33546 363/21.04 |
| 2018/0177010 A1 * | 6/2018 | Liu .................. H02M 3/33523 |

FOREIGN PATENT DOCUMENTS

| | | |
|---|---|---|
| TW | 201412000 A | 3/2014 |
| TW | I677153 B | 11/2019 |

\* cited by examiner

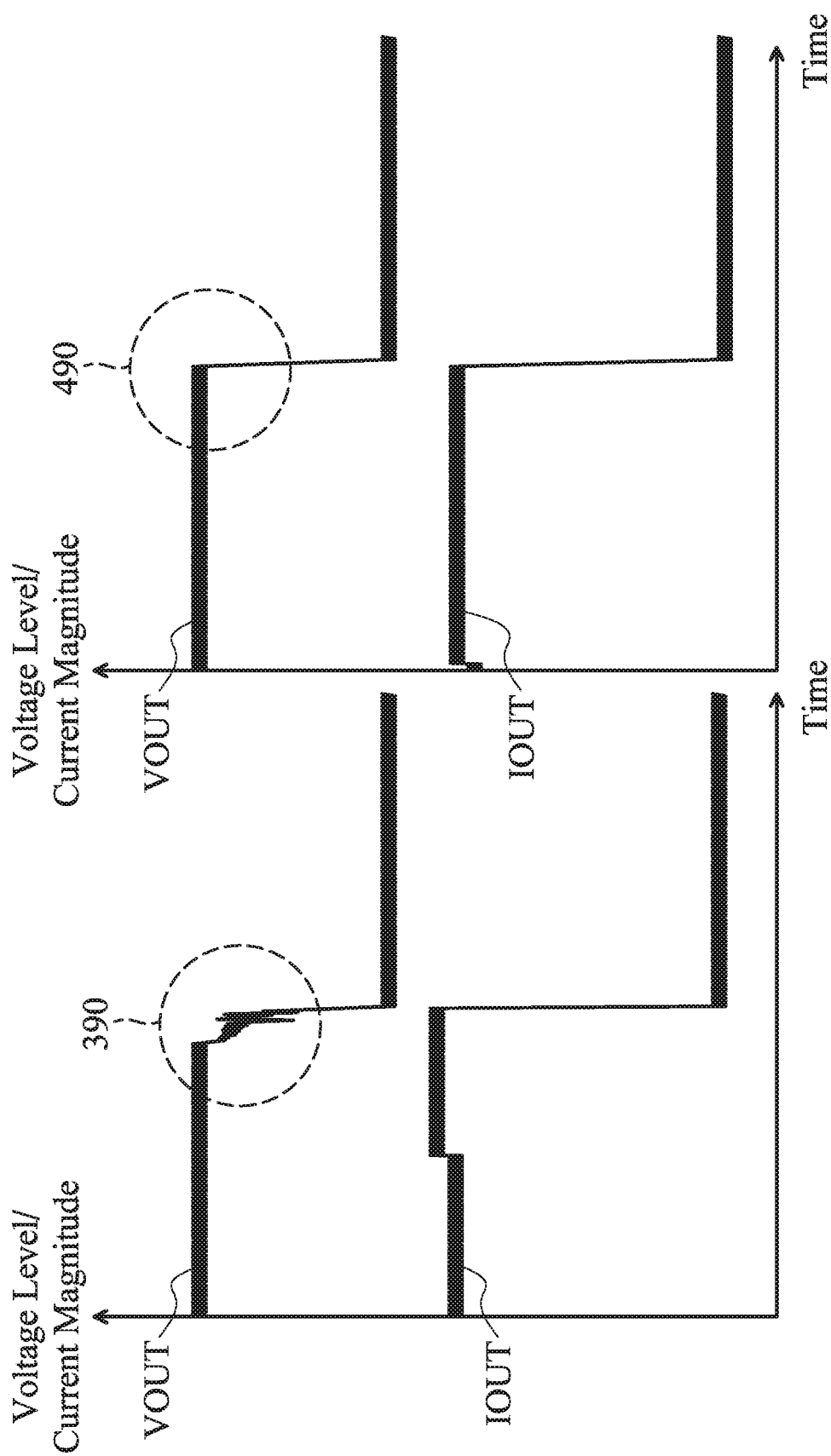

POWER SUPPLY DEVICE FOR ELIMINATING MALFUNCTION OF OVERCURRENT PROTECTION

CROSS REFERENCE TO RELATED APPLICATIONS

This Application claims priority of Taiwan Patent Application No. 109111179 filed on Apr. 1, 2020, the entirety of which is incorporated by reference herein.

BACKGROUND OF THE INVENTION

Field of the Invention

The disclosure generally relates to a power supply device, and more specifically, to a power supply device for eliminating the malfunction of overcurrent protection.

Description of the Related Art

A conventional power supply device usually includes a feedback compensation circuit and a detection circuit for overcurrent protection. However, when an output current is too large and triggers the overcurrent protection mechanism, the feedback compensation circuit may accidentally participate in it and cause the corresponding malfunction. This malfunction causes the output voltage to fluctuate up and down. Accordingly, there is a need to propose a novel solution for solving the problems of the prior art.

BRIEF SUMMARY OF THE INVENTION

In a preferred embodiment, the invention is directed to a power supply device for eliminating the malfunction of overcurrent protection. The power supply device includes a first transformer, a power switch element, an output stage circuit, a detection circuit, a feedback compensation circuit, a PWM (Pulse Width Modulation) IC (Integrated Circuit), a second transformer, and a control circuit. The first transformer includes a first main coil and a first secondary coil. The first main coil receives an input voltage. The first secondary coil generates an induced voltage. The power switch element selectively couples the first main coil to a ground voltage. The output stage circuit generates an output current according to the induced voltage. The detection circuit monitors the output current and generates a detection voltage according to the output current. The feedback compensation circuit is coupled to the output stage circuit. The feedback compensation circuit generates a feedback voltage and a coupling current. The feedback compensation circuit includes a linear optical coupler and a voltage regulator. The PWM IC generates a PWM voltage according to the feedback voltage. The second transformer includes a second main coil and a second secondary coil. The second main coil receives the coupling current. The second secondary coil generates a control voltage. The control circuit selectively enables or disables the linear optical coupler and the voltage regulator according to the detection voltage and the control voltage.

BRIEF DESCRIPTION OF DRAWINGS

The invention can be more fully understood by reading the subsequent detailed description and examples with references made to the accompanying drawings, wherein:

FIG. 3 is a diagram of voltage waveforms of a conventional power supply device; and FIG. 4 is a diagram of voltage waveforms of a power supply device according to an embodiment of the invention.

DETAILED DESCRIPTION OF THE INVENTION

In order to illustrate the purposes, features and advantages of the invention, the embodiments and figures of the invention are described in detail below.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
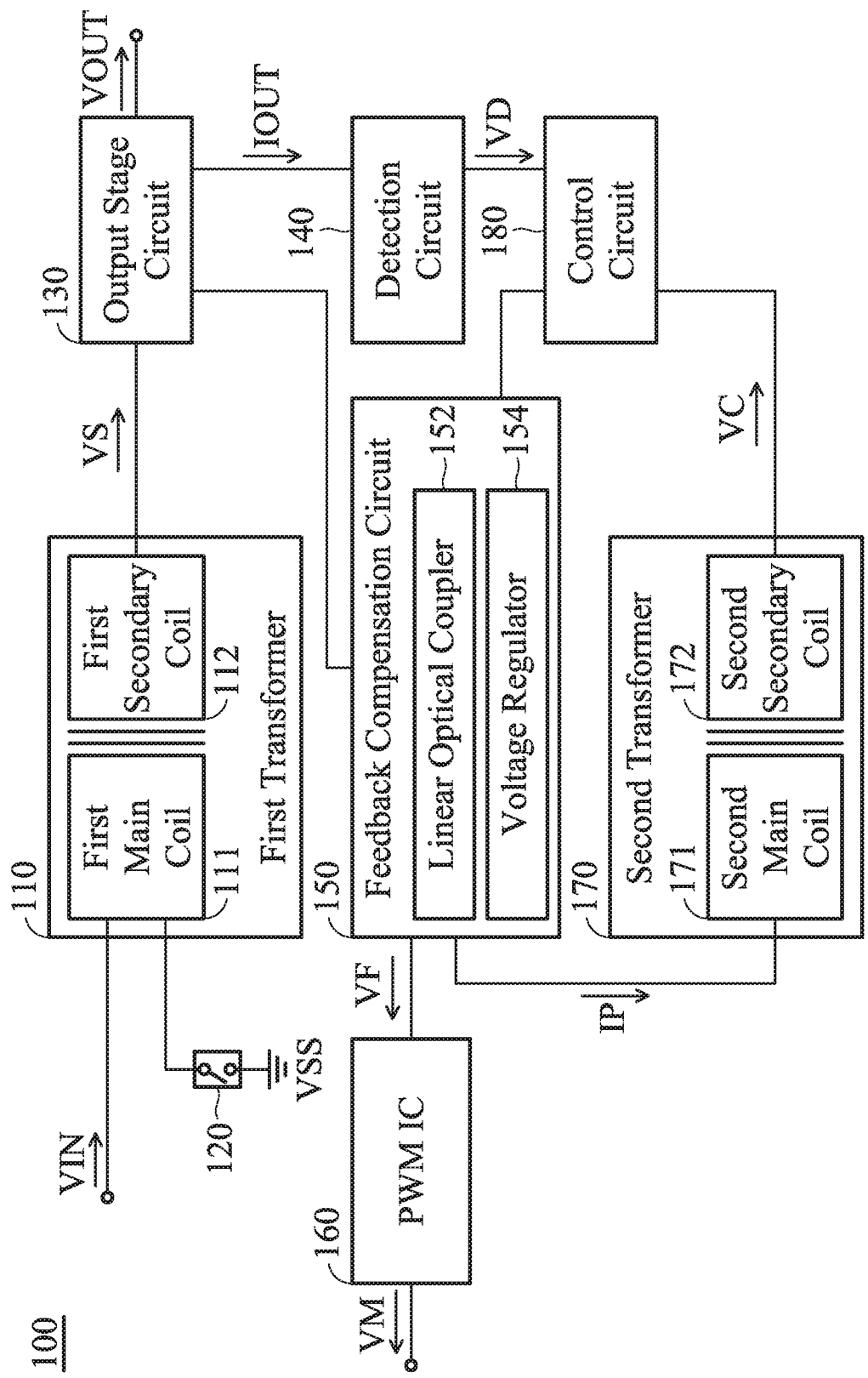
FIG. 1 is a diagram of a power supply device according to an embodiment of the invention.

FIG. 1 is a diagram of a power supply device 100 according to an embodiment of the invention. For example, the power supply device 100 may be applied to a desktop computer, a notebook computer, or an all-in-one computer. As shown in FIG. 1, the power supply device 100 includes a first transformer 110, a power switch element 120, an output stage circuit 130, a detection circuit 140, a feedback compensation circuit 150, a PWM (Pulse Width Modulation) IC (Integrated Circuit) 160, a second transformer 170, and a control circuit 180. It should be noted that the power supply device 100 may further include other components, such as a voltage regulator and/or a negative feedback circuit, although they are not displayed in FIG. 1.

The first transformer 110 includes a first main coil 111 and a first secondary coil 112. The first main coil 111 is positioned at one side of the first transformer 110. The first secondary coil 112 is positioned at the opposite side of the first transformer 110. The first main coil 111 receives an input voltage VIN. In response to the input voltage VIN, the first secondary coil 112 generates an induced voltage VS. The input voltage VIN may be from an external input power source. The input voltage VIN may have any frequency and any magnitude. For example, the frequency of the input voltage VIN may be about 50 Hz or 60 Hz, and the RMS (Root-Mean-Square) value of the input voltage VIN may be about 110V or 220V, but they are not limited thereto. The power switch element 120 selectively couples the first main coil 111 to a ground voltage VSS (e.g., 0V). The output stage circuit 130 generates an output current IOUT according to the induced voltage VS. The detection circuit 140 monitors the output current IOUT, and generates a detection voltage VD according to the output current IOUT. In some embodiments, the output stage circuit 130 further generates an output voltage VOUT, which may be transmitted to an electronic device. The feedback compensation circuit 150 is coupled to the output stage circuit 130, and is configured to generate a feedback voltage VF and a coupling current IP. The feedback compensation circuit 150 includes a linear optical coupler 152 and a voltage regulator 154. The PWM IC generates a PWM voltage VM according to the feedback voltage VF. The second transformer 170 includes a second main coil 171 and a second secondary coil 172. The second main coil 171 is positioned at one side of the second transformer 170. The second secondary coil 172 is positioned at the opposite side of the second transformer 170. The second main coil 171 receives the coupling current IP. In response to the coupling current IP, the second secondary coil 172 generates a control voltage VC. The control circuit 180 selectively enables or disables the linear optical coupler 152 and the voltage regulator 154 according to the detection voltage VD and the control voltage VC. In some embodiments, if the output current IOUT does not reach a threshold value, the control circuit 180 will enable both the linear optical coupler 152 and the voltage regulator 154; conversely, if the output current IOUT reaches the threshold value, the control circuit 180 will disable both the linear optical coupler 152 and the voltage regulator 154. Using this design, while the overcurrent protection mechanism is operating, the linear optical coupler 152 and the voltage regulator 154 of the feedback compensation circuit 150 are both disabled by the control circuit 180. This can effectively prevent the feedback compensation circuit 150 from participating in overcurrent protection. Therefore, the invention can eliminate overcurrent protection malfunctions and improve the output stability of the power supply device 100.

The following embodiments will introduce the detailed structure and operation of the power supply device 100. It should be understood these figures and descriptions are merely exemplary, rather than limitations of the invention.

Figure 2:
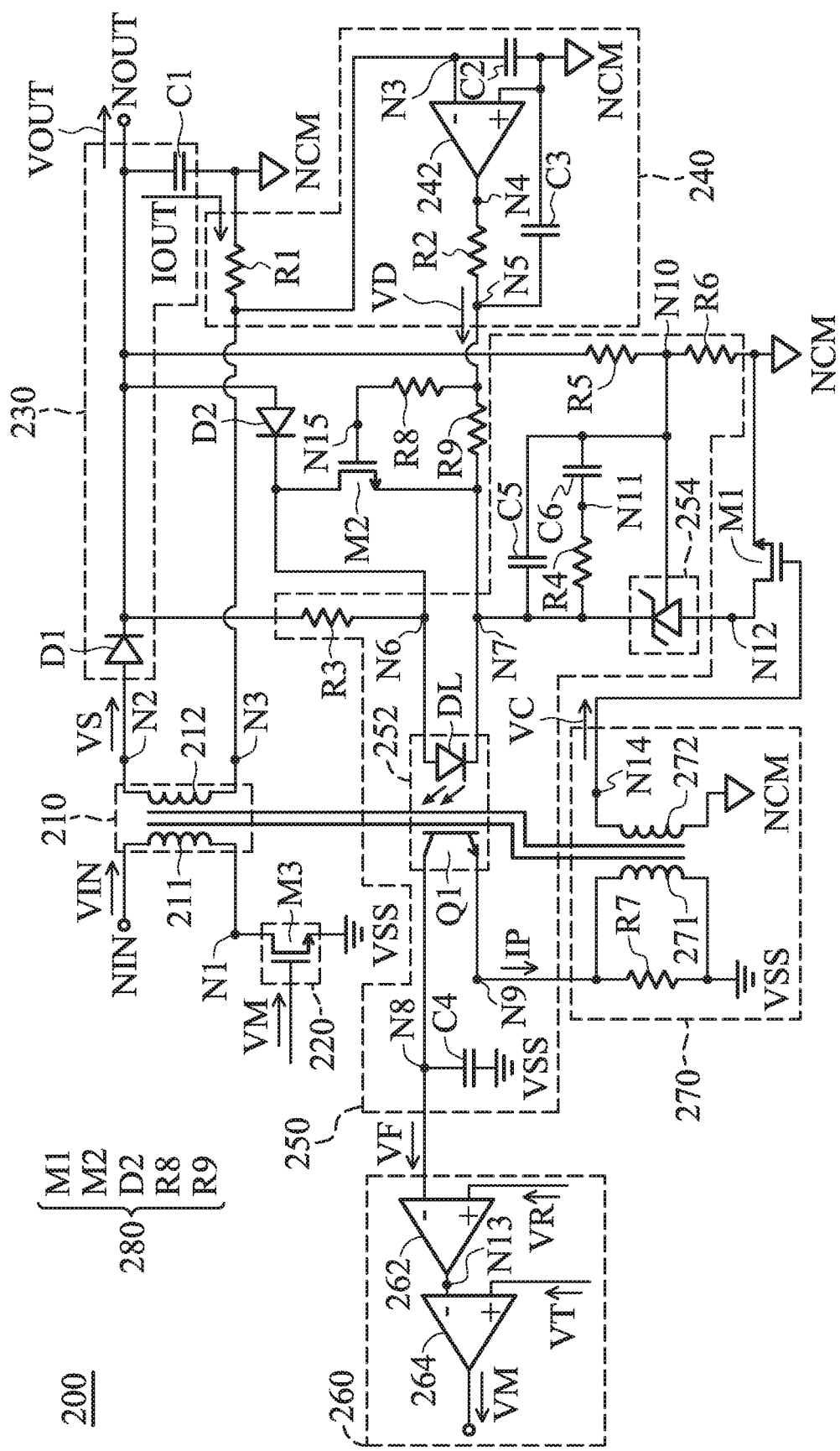
FIG. 2 is a diagram of a power supply device according to an embodiment of the invention.

FIG. 2 is a diagram of a power supply device 200 according to an embodiment of the invention. In the embodiment of FIG. 2, the power supply device 200 with an input node NIN and an output node NOUT includes a first transformer 210, a power switch element 220, an output stage circuit 230, a detection circuit 240, a feedback compensation circuit 250, a PWM IC 260, a second transformer 270, and a control circuit 280. The input node NIN of the power supply device 200 is arranged for receiving an input voltage VIN from an external input power source. The output node NOUT of the power supply device 200 is arranged for outputting an output voltage VOUT to an electronic device.

The first transformer 210 includes a first main coil 211 and a first secondary coil 212. The first main coil 211 is positioned at one side of the first transformer 210. The first secondary coil 212 is positioned at the opposite side of the first transformer 210. The first main coil 212 has a first terminal coupled to the input node NIN, and a second terminal coupled to a first node N1. In some embodiments, the power switch element 220 selectively couples the first node N1 to a ground voltage VSS (e.g., 0V) according to a PWM voltage VM. For example, if the PWM voltage VM has a high logic level, the power switch element 220 will couple the first node N1 to the ground voltage VSS (i.e., the power switch element 220 is similar to a short-circuited path); conversely, if the PWM voltage VM has a low logic level, the power switch element 220 will not couple the first node N1 to the ground voltage VSS (i.e., the power switch element 220 is similar to an open-circuited path). The first secondary coil 212 has a first terminal coupled to a second node N2 for outputting an induced voltage VS, and a second terminal coupled to a third node N3.

The output stage circuit 230 includes a first diode D1 and a first capacitor C1. The first diode D1 has an anode coupled to the second node N2 for receiving the induced voltage VS, and a cathode coupled to the output node NOUT. The first capacitor C1 has a first terminal coupled to the output node NOUT, and a second terminal coupled to a common node NCM for outputting an output current IOUT.

The detection circuit 240 includes an amplifier 242, a first resistor R1, a second resistor R2, a second capacitor C2, and a third capacitor C3. The first resistor R1 has a first terminal coupled to the third node N3, and a second terminal coupled to the common node NCM for receiving the output current IOUT. The second capacitor C2 has a first terminal coupled to the third node N3, and a second terminal coupled to the common node NCM. The amplifier 242 has a positive input terminal coupled to the common node NCM, a negative input terminal coupled to the third node N3, and an output terminal coupled to a fourth node N4. The second resistor R2 has a first terminal coupled to a fifth node N5 for outputting a detection voltage VD, and a second terminal coupled to the fourth node N4. The third capacitor C3 has a first terminal coupled to the fifth node N5, and a second terminal coupled to the common node NCM. When the output current IOUT flows through the first resistor R1, the amplifier 242 amplifies a voltage difference between the first terminal and the second terminal of the first resistor R1, and then the detection circuit 240 generates the detection voltage VD corresponding to the output current IOUT.

The feedback compensation circuit 250 includes a linear optical coupler 252, a voltage regulator 254, a third resistor R3, a fourth resistor R4, a fifth resistor R5, a sixth resistor R6, a fourth capacitor C4, a fifth capacitor C5, and a sixth capacitor C6. The third resistor R3 has a first terminal coupled to the output node NOUT, and a second terminal coupled to a sixth node N6. In some embodiments, the linear optical coupler 252 is implemented with a PC817 electronic component. The linear optical coupler 252 includes an LED (Light-Emitting Diode) DL and a BJT (Bipolar Junction Transistor) Q1. The LED DL has an anode coupled to the sixth node N6, and a cathode coupled to a seventh node N7. The BJT Q1 has a collector coupled to an eighth node N8 for outputting a feedback voltage VF, and an emitter coupled to a ninth node N9 for outputting a coupling current IP. The fourth capacitor C4 has a first terminal coupled to the eighth node N8, and a second terminal coupled to the ground voltage VSS. The fifth capacitor C5 has a first terminal coupled to the seventh node N7, and a second terminal coupled to a tenth node N10. The fourth resistor R4 has a first terminal coupled to the seventh node N7, and a second terminal coupled to an eleventh node N11. The sixth capacitor C6 has a first terminal coupled to the eleventh node N11, and a second terminal coupled to the tenth node N10. The fifth resistor R5 has a first terminal coupled to the output node NOUT, and a second terminal coupled to the tenth node N10. The sixth resistor R6 has a first terminal coupled to the tenth node N10, and a second terminal coupled to the common node NCM. In some embodiments, the voltage regulator 254 is implemented with a TL431 electronic component. The voltage regulator 254 has an anode coupled to a twelfth node N12, a cathode coupled to the seventh node N7, and a reference terminal coupled to the tenth node N10.

The PWM IC 260 includes an error amplifier 262 and a comparator 264. The error amplifier 262 has a positive input terminal for receiving a reference voltage VR, a negative input terminal coupled to the eighth node N8 for receiving the feedback voltage VF, and an output terminal coupled to a thirteenth node N13. The comparator 264 has a positive input terminal for receiving a triangular-wave voltage VT, a negative input terminal coupled to the thirteenth node N13, and an output terminal for outputting the PWM voltage VM. The PWM voltage VM is used to adjust the duty cycle of the power switch element 220.

The second transformer 270 includes a second main coil 271, a second secondary coil 272, and a seventh resistor R7. The second main coil 271 and the seventh resistor R7 are positioned at the same side of the second transformer 270. The second secondary coil 272 is positioned at the opposite side of the second transformer 270. The seventh resistor R7 has a first terminal coupled to the ninth node N9 for receiving the coupling current IP, and a second terminal coupled to the ground voltage VSS. The second main coil 271 has a first terminal coupled to the ninth node N9, and a second terminal coupled to the ground voltage VSS. The second secondary coil 272 has a first terminal coupled to a fourteenth node N14 for outputting a control voltage VC, and a second terminal coupled to the common node NCM. A voltage difference between the first terminal and the second terminal of the seventh resistor R7 is proportional to the magnitude of the coupling current IP. Thus, if the coupling current IP increases, the control voltage VC will become higher; conversely, if the coupling current IP decreases, the control voltage VC will become lower.

The control circuit 280 includes a first transistor M1, a second transistor M2, a second diode D2, an eighth resistor R8, and a ninth resistor R9. Each of the first transistor M1 and the second transistor M2 may be an NMOS transistor (N-type Metal Oxide Semiconductor Field Effect Transistor). The first transistor M1 has a control terminal coupled to the fourteenth node N14 for receiving the control voltage VC, a first terminal coupled to the common node NCM, and a second terminal coupled to the twelfth node N12. The second diode D2 has an anode coupled to the output node NOUT, and a cathode coupled to the sixth node N6. The eighth resistor R8 has a first terminal coupled to a fifteenth node N15, and a second terminal coupled to the fifth node N5 for receiving the detection voltage VD. The second transistor M2 has a control terminal coupled to the fifteenth node N15, a first terminal coupled to the seventh node N7, and a second terminal coupled to the sixth node N6. The ninth resistor R9 has a first terminal coupled to the seventh node N7, and a second terminal coupled to the fifth node N5. In some embodiments, the resistance of the ninth resistor R9 is at least two or more times the resistance of the eighth resistor R8.

In some embodiments, the power switch element 220 includes a third transistor M3. The third transistor M3 may be an NMOS transistor. The third transistor M3 has a control terminal for receiving the PWM voltage VM, a first terminal coupled to the ground voltage VSS, and a second terminal coupled to the first node N1.

In some embodiments, the power supply device 200 operates in a normal mode or a protection mode, and their operating principles are described below.

In the normal mode, the output current IOUT does not reach a threshold value, and the detection circuit 240 generates a relatively low detection voltage VD for turning off the second transistor M2. At this time, the linear optical coupler 252 is enabled. The LED DL generates light, inducing the BJT Q1 to output a coupling current IP. In response to the coupling current IP, the second transformer 270 generates a relatively high control voltage VC for turning on the first transistor M1, so as to enable the voltage regulator 254.

In the protection mode, the output current IOUT reaches the threshold value, and the detection circuit 240 generates a relatively high detection voltage VD for turning on the second transistor M2. At this time, since a short-circuited path is formed by the second transistor M2, the linear optical coupler 252 is disabled. The LED DL cannot generate any light, and the BJT Q1 cannot output the coupling current IP. Thus, the second transformer 270 generates a relatively low control voltage VC for turning off the first transistor M1, so as to disable the voltage regulator 254. In other words, the feedback compensation circuit 250 does not participate in the overcurrent protection mechanism of the power supply device 200. Furthermore, because the BJT Q1 cannot generate feedback voltage VF, the PWM IC 260 stops outputting the PWM voltage VM, and it concurrently turns off the power supply device 200 and the power switch element 220.

FIG. 3 is a diagram of voltage waveforms of a conventional power supply device. The horizontal axis represents time, and the vertical axis represents voltage level or current magnitude. If the second transformer 270 and the control circuit 280 are not used while the overcurrent protection mechanism is operating, the output voltage VOUT of the conventional power supply device will fluctuate up and down (as indicated by a first dash-line box 390), which may result from an overcurrent protection malfunction caused by accidental participation by the feedback compensation circuit.

FIG. 4 is a diagram of voltage waveforms of the power supply device 200 according to an embodiment of the invention. The horizontal axis represents time, and the vertical axis represents voltage level or current magnitude. According to the measurement of FIG. 4, if the second transformer 270 and the control circuit 280 are used while the overcurrent protection mechanism is operating, the linear optical coupler 252 and the voltage regulator 254 of the feedback compensation circuit 250 will be temporarily disabled, thereby eliminating overcurrent protection malfunctions (as indicated by a second dash-line box 490).

In some embodiments, the element parameters of the power supply device 200 are as follows: The resistance of the first resistor R1 may be from 0.99 mΩ to 1.01 mΩ, such as 1 mΩ. The resistance of the second resistor R2 may be from 9.9 Ω to 10.1Ω, such as 10Ω. The resistance of the third resistor R3 may be from 9.5 KΩ to 10.5 KΩ, such as 10 KΩ. The resistance of the fourth resistor R4 may be from 44.65 KΩ to 49.35 KΩ, such as 47 KΩ. The resistance of the fifth resistor R5 may be from 66.31 KΩ to 73.29 KΩ, such as 69.8 KΩ. The resistance of the sixth resistor R6 may be from 9.69 KΩ to 10.71 KΩ, such as 10.2 KΩ. The resistance of the seventh resistor R7 may be from 14.25 KΩ to 15.75 KΩ, such as 15 KΩ. The resistance of the eighth resistor R8 may be from 0.99 KΩ to 1.01 KΩ, such as 1 KΩ. The resistance of the ninth resistor R9 may be from 2.48 KΩ to 2.53 KΩ, such as 2.5 KΩ. The capacitance of the first capacitor C1 may be from 2850 μF to 3150 μF, such as 3000 μF. The capacitance of the second capacitor C2 may be from 0.99 μF to 1.01 μF, such as 1 μF. The capacitance of the third capacitor C3 may be from 0.99 μF to 1.01 μF, such as 1 μF. The capacitance of the fourth capacitor C4 may be from 99 pF to 101 pF, such as 100 pF. The capacitance of the fifth capacitor C5 may be from 1.49 nF to 1.51 nF, such as 1.5 nF. The capacitance of the sixth capacitor C6 may be from 46.53 nF to 47.47 nF, such as 47 nF. The turn ratio of the first main coil 211 to the first secondary coil 212 may be from 5 to 100, such as 20. The turn ratio of the second main coil 271 to the second secondary coil 272 may be from 0.01 to 1, such as 0.1. The phase margin of the power supply device 200 may be greater than 45 degrees. The gain margin of the power supply device 200 may be greater than −10 dB. The above ranges of parameters are calculated and obtained according to the results of many experiments, and they help to optimize the output stability of the power supply device 200.

The invention proposes a novel power supply device, which includes a control circuit for selectively enabling or disabling a feedback compensation circuit. According to practical measurements, the power supply device using the aforementioned design can eliminate the malfunction of overcurrent protection. Since the invention can improve the output stability of the power supply device, it is suitable for application in a variety of devices.

Note that the above voltages, currents, resistances, inductances, capacitances and other element parameters are not limitations of the invention. A designer can adjust these parameters according to different requirements. The power supply device of the invention is not limited to the configurations of FIGS. 1-4. The invention may merely include any one or more features of any one or more embodiments of FIGS. 1-4. In other words, not all of the features displayed in the figures should be implemented in the power supply device of the invention. Although the embodiments of the invention use MOSFET as examples, the invention is not limited thereto, and those skilled in the art may use other types of transistors, such as BJT (Bipolar Junction Transistor), JFET (Junction Gate Field Effect Transistor), FinFET (Fin Field Effect Transistor), etc., without affecting the performance of the invention.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. A power supply device for eliminating malfunction of overcurrent protection, comprising:
   a first transformer, comprising a first main coil and a first secondary coil, wherein the first main coil receives an input voltage, and the first secondary coil generates an induced voltage;
   a power switch element, selectively coupling the first main coil to a ground voltage;
   an output stage circuit, generating an output current according to the induced voltage;
   a detection circuit, monitoring the output current, and generating a detection voltage according to the output current;
   a feedback compensation circuit, coupled to the output stage circuit, and generating a feedback voltage and a coupling current, wherein the feedback compensation circuit comprises a linear optical coupler and a voltage regulator;
   a PWM (Pulse Width Modulation) IC (Integrated Circuit), generating a PWM voltage according to the feedback voltage;
   a second transformer, comprising a second main coil and a second secondary coil, wherein the second main coil receives the coupling current, and the second secondary coil generates a control voltage; and
   a control circuit, selectively enabling or disabling the linear optical coupler and the voltage regulator according to the detection voltage and the control voltage;

wherein the PWM IC comprises:
   an error amplifier, wherein the error amplifier has a positive input terminal for receiving a reference voltage, a negative input terminal for receiving the feedback voltage, and an output terminal coupled to a thirteenth node; and
   a comparator, wherein the comparator has a positive input terminal for receiving a triangular-wave voltage, a negative input terminal coupled to the thirteenth node, and an output terminal for outputting the PWM voltage.

2. The power supply device as claimed in claim 1, wherein the first main coil has a first terminal coupled to an input node for receiving the input voltage, and a second terminal coupled to a first node, wherein the power switch element selectively couples the first node to the ground voltage according to the PWM voltage, and wherein the first secondary coil has a first terminal coupled to a second node for outputting the induced voltage, and a second terminal coupled to a third node.

3. The power supply device as claimed in claim 2, wherein the output stage circuit comprises:
   a first diode, wherein the first diode has an anode coupled to the second node for receiving the induced voltage, and a cathode coupled to an output node; and
   a first capacitor, wherein the first capacitor has a first terminal coupled to the output node, and a second terminal coupled to a common node for outputting the output current.

4. The power supply device as claimed in claim 3, wherein the detection circuit comprises:
   a first resistor, wherein the first resistor has a first terminal coupled to the third node, and a second terminal coupled to the common node for receiving the output current; and
   a second capacitor, wherein the second capacitor has a first terminal coupled to the third node, and a second terminal coupled to the common node.

5. The power supply device as claimed in claim 3, wherein the detection circuit further comprises:
   an amplifier, wherein the amplifier has a positive input terminal coupled to the common node, a negative input terminal coupled to the third node, and an output terminal coupled to a fourth node;
   a second resistor, wherein the second resistor has a first terminal coupled to a fifth node for outputting the detection voltage, and a second terminal coupled to the fourth node; and
   a third capacitor, wherein the third capacitor has a first terminal coupled to the fifth node, and a second terminal coupled to the common node.

6. The power supply device as claimed in claim 5, wherein the feedback compensation circuit further comprises:
   a third resistor, wherein the third resistor has a first terminal coupled to the output node, and a second terminal coupled to a sixth node;
   wherein the linear optical coupler includes an LED (Light-Emitting Diode) and a BJT (Bipolar Junction Transistor), wherein the LED has an anode coupled to the sixth node, and a cathode coupled to a seventh node, and wherein the BJT has a collector coupled to an eighth node for outputting the feedback voltage, and an emitter coupled to a ninth node for outputting the coupling current.

7. The power supply device as claimed in claim 6, wherein the feedback compensation circuit further comprises:

a fourth capacitor, wherein the fourth capacitor has a first terminal coupled to the eighth node, and a second terminal coupled to the ground voltage;

a fifth capacitor, wherein the fifth capacitor has a first terminal coupled to the seventh node, and a second terminal coupled to a tenth node;

a fourth resistor, wherein the fourth resistor has a first terminal coupled to the seventh node, and a second terminal coupled to an eleventh node; and a sixth capacitor, wherein the sixth capacitor has a first terminal coupled to the eleventh node, and a second terminal coupled to the tenth node.

8. The power supply device as claimed in claim 7, wherein the feedback compensation circuit further comprises:

a fifth resistor, wherein the fifth resistor has a first terminal coupled to the output node, and a second terminal coupled to the tenth node; and a sixth resistor, wherein the sixth resistor has a first terminal coupled to the tenth node, and a second terminal coupled to the common node;

wherein the voltage regulator has an anode coupled to a twelfth node, a cathode coupled to the seventh node, and a reference terminal coupled to the tenth node.

9. The power supply device as claimed in claim 8, wherein the second transformer further comprises a seventh resistor, wherein the seventh resistor has a first terminal coupled to the ninth node for receiving the coupling current, and a second terminal coupled to the ground voltage, wherein the second main coil has a first terminal coupled to the ninth node, and a second terminal coupled to the ground voltage, and wherein the second secondary coil has a first terminal coupled to a fourteenth node for outputting the control voltage, and a second terminal coupled to the common node.

10. The power supply device as claimed in claim 9, wherein the control circuit comprises:

a first transistor, wherein the first transistor has a control terminal coupled to the fourteenth node for receiving the control voltage, a first terminal coupled to the common node, and a second terminal coupled to the twelfth node.

11. The power supply device as claimed in claim 10, wherein the control circuit further comprises:

a second diode, wherein the second diode has an anode coupled to the output node, and a cathode coupled to the sixth node;

an eighth resistor, wherein the eighth resistor has a first terminal coupled to a fifteenth node, and a second terminal coupled to the fifth node for receiving the detection voltage;

a second transistor, wherein the second transistor has a control terminal coupled to the fifteenth node, a first terminal coupled to the seventh node, and a second terminal coupled to the sixth node; and a ninth resistor, wherein the ninth resistor has a first terminal coupled to the seventh node, and a second terminal coupled to the fifth node.

12. The power supply device as claimed in claim 11, wherein a resistance of the ninth resistor is at least twice that of the eighth resistor.

13. The power supply device as claimed in claim 12, wherein if the output current does not reach a threshold value, the detection voltage is relatively low for turning off the second transistor, and the control voltage is relatively high for turning on the first transistor, so that the linear optical coupler and the voltage regulator are both enabled.

14. The power supply device as claimed in claim 13, wherein if the output current reaches the threshold value, the detection voltage is relatively high for turning on the second transistor, and the control voltage is relatively low for turning off the first transistor, so that the linear optical coupler and the voltage regulator are both disabled.

* * * * *